United States Patent
Chen et al.

(10) Patent No.: US 6,399,479 B1
(45) Date of Patent: Jun. 4, 2002

(54) PROCESSES TO IMPROVE ELECTROPLATING FILL

(75) Inventors: Fusen Chen, Cupertino; Zheng Xu, Foster City; Peijun Ding, San Jose; Barry Chin, Saratoga; Ashok Sinha, Palo Alto, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/386,077

(22) Filed: Aug. 30, 1999

(51) Int. Cl.⁷ .......................................... H01L 21/4763
(52) U.S. Cl. ........................ 438/628; 438/637; 438/674
(58) Field of Search ................................ 438/400, 625, 438/626, 627, 628, 637–641, 672–675; 257/437

(56) References Cited

U.S. PATENT DOCUMENTS

| | | |
|---|---|---|
| 5,723,387 A | 3/1998 | Chen |
| 5,761,802 A | 6/1998 | Grigas ........................ 29/852 |
| 5,972,192 A * | 10/1999 | Dubin et al. ................ 205/101 |
| 6,069,068 A * | 5/2000 | Rathore et al. ............. 438/628 |
| 6,120,641 A * | 9/2000 | Stevens et al. ............. 156/345 |

FOREIGN PATENT DOCUMENTS

| | | | |
|---|---|---|---|
| EP | 0 504 984 | 3/1992 | .......... H01L/21/90 |
| EP | 0 514 103 | 5/1992 | ........ H01L/21/285 |
| EP | 0 844 313 | 5/1998 | .......... C23C/14/04 |

OTHER PUBLICATIONS

Changsun Ryu, *Microstructure and Reliability of Copper Interconnects*, "Chapter 4 Microstructure of Electroplated Copper," pp. 65–76, 1998.

* cited by examiner

*Primary Examiner*—David Nelms
*Assistant Examiner*—Dung A Le
(74) *Attorney, Agent, or Firm*—Moser, Patterson & Sheridan, L.L.P.

(57) ABSTRACT

The invention provides a method for filling a structure on a substrate comprising: depositing a barrier layer on one or more surfaces of the structure, depositing a seed layer over the barrier layer, removing a portion of the seed layer, and electrochemically depositing a metal to fill the structure. Preferably, a portion or all of the seed layer formed on the sidewall portion of the structure is removed using a electrochemical de-plating process prior to the electroplating process.

20 Claims, 5 Drawing Sheets

PROCESSES TO IMPROVE ELECTROPLATING FILL

BACKGROUND OF THE INVENTION

1. Field of the Invention

The present invention generally relates to electrochemical deposition or electroplating a metal onto a substrate. More particularly, the present invention relates to methods of forming a barrier layer and a seed layer prior to filling the structures on a substrate using an electroplating process.

2. Background of the Related Art

Copper has become a metal of choice for filling sub-micron, high aspect ratio interconnect features on substrates as circuit densities increase for the next generation of ultra large scale integration, because copper and its alloys have lower resistivities than aluminum and significantly higher electromigration resistance as compared to aluminum. These characteristics are important to enable higher current densities experienced at high levels of integration and increased device speed.

To increase circuit densities, the aspect ratios for the features forming the device interconnections, i.e., the ratio for the feature height to the feature width, must increase. Many traditional deposition processes have difficulty filling structures where the aspect ratio exceeds 4:1, and particularly where the feature aspect ratio exceeds 10:1 and the width of the feature is on the order of 100 nanometers wide. Therefore, there is a great amount of ongoing effort being directed at the formation of void-free, sub-micron features having high aspect ratios where the ratio of feature height to feature width can be 4:1 or higher. Additionally, as the feature widths decrease, the interconnect features experience increased current densities that require void-less formation of the metal having acceptable crystalline structure within the interconnect feature.

Despite the desirability of using copper for semiconductor device fabrication, choices of fabrication methods for depositing copper into very high aspect ratio features are limited because common chemical vapor deposition processes and physical vapor deposition processes have provided unsatisfactory results. Furthermore, these processes can be costly. As a result, electroplating or electrochemical deposition is becoming an accepted method for copper metallization of interconnect features on semiconductor devices.

FIGS. 1A–1E illustrate a typical metallization technique for forming interconnect features in a multi-layered substrate 10. Generally, the method comprises physical vapor depositing a barrier layer over the feature surfaces, physical vapor depositing a conductive metal seed layer, preferably copper, over the barrier layer, and then electroplating a conductive metal, preferably copper, over the seed layer to fill the interconnect structure/feature. Finally, the deposited layers and the dielectric layers are planarized, such as by chemical mechanical polishing (CMP), to define a conductive interconnect feature.

FIGS. 1A through 1E are cross sectional views of a substrate 10 having multi-layered structures including a dielectric layer 12 formed over an underlying layer 14 which contains an electrically conducting feature 16. The underlying layer 14 may take the form of a doped silicon substrate or it may be a first or subsequent dielectric/insulating layer formed on a substrate. The dielectric layer 12 is formed over the underlying layer 14 in accordance with procedures known in the art, such as dielectric CVD, to form a part of the overall integrated circuit. Once deposited, the dielectric layer 12 is patterned and etched to form interconnect features, such as vias, contacts and lines. Etching of the dielectric layer 12 can be accomplished using various generally known dielectric etching processes, including plasma etching. Although a dual damascene structure and a connection line are illustrated in FIGS. 1A–1E, other types of interconnect features are typically metallized using this technique as well.

Figure 1A:
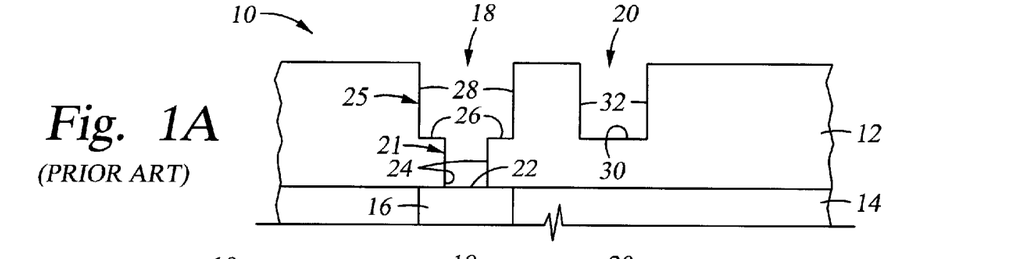
FIGS. 1A–1E are cross sectional views of a dual damascene interconnect and a connection line in a dielectric layer illustrating a metallization technique for forming such interconnect.

Referring to FIG. 1A, a partial cross-sectional diagram of a substrate 10 is shown having a dual damascene structure 18 and a connection line 20 patterned and etched in the dielectric layer 12. The dual damascene structure 18 typically comprises a via portion 21 and a trench portion 25. The via portion 21 of the dual damascene structure 18 is defined by a via floor 22 exposing at least a portion of the conductive feature 16 and lower sidewalls 24. The trench portion 25 of the dual damascene structure 18 is defined by the step surfaces 26 and upper sidewalls 28. FIG. 1A also shows a connection line 20 which is typically formed through a groove on the surface of the dielectric layer 12 that provides electrical connections across the surface of the dielectric layer 12 to other structures and/or devices. The connection line 20 is defined by a line bottom surface 30 and line sidewalls 32 etched in the dielectric layer 12.

Figure 1B:
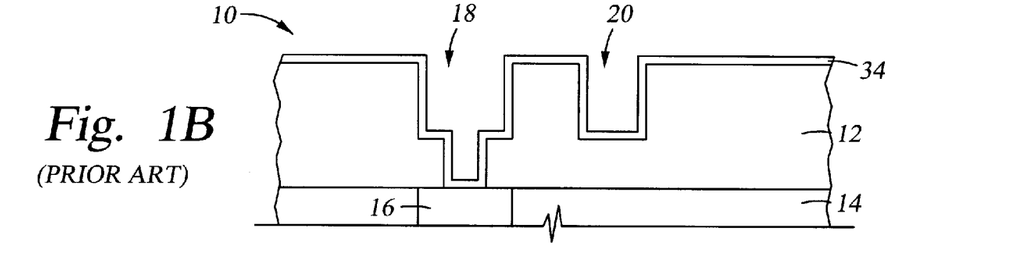

Referring to FIG. 1B, a barrier layer 34, preferably comprising tantalum (Ta) or tantalum nitride (TaN), is deposited over the surface of the substrate 10, including the surfaces of the dual damascene structure 18 and the connection line 20. The barrier layer is typically deposited using physical vapor deposition (PVD) by sputtering a tantalum target in an argon plasma or by reactive physical vapor deposition by sputtering a tantalum target in a nitrogen/argon plasma. Other deposition processes, such as chemical vapor deposition (CVD) or combination of CVD/PVD, may be used to deposit the barrier layer for improved texture and film properties. The barrier layer limits the diffusion of copper into the semiconductor substrate and the dielectric layer and thereby dramatically increases the reliability of the copper interconnect features. It is preferred that the barrier layer has a thickness between about 25 Å and about 400 Å, most preferably about 100 Å.

Figure 1C:
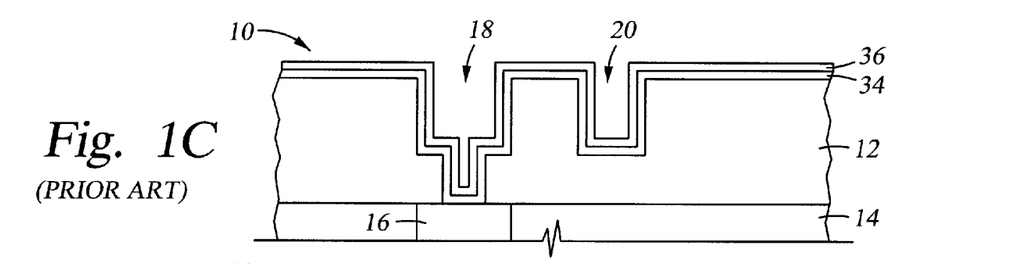

Referring to FIG. 1C, a copper seed layer 36 is deposited over the barrier layer 34 using PVD. Other metals, particularly noble metals, can also be used for the seed layer. The copper seed layer 36 provides good adhesion for a subsequently electroplated copper layer.

Figure 1D:
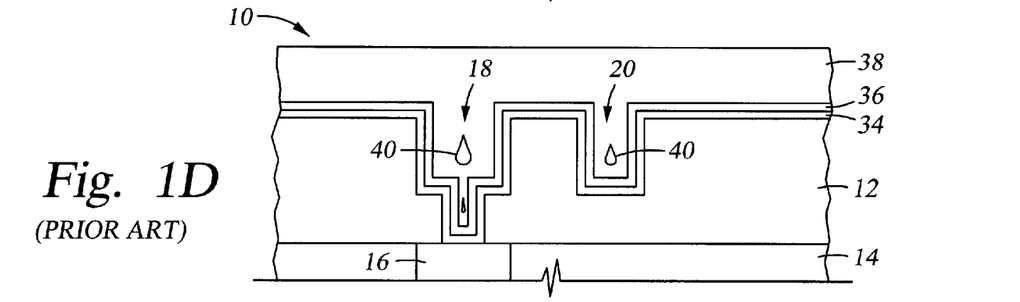

Referring to FIG. 1D, a copper layer 38 is electroplated over the copper seed layer 36 to metallize the dual damascene structure 18 and the line connection 20. However, the electroplating metallization process presently practiced may yield voids 40 in the interconnect features that may lead to defective devices or premature breakdown of the devices, as discussed in more detail below.

Figure 1E:
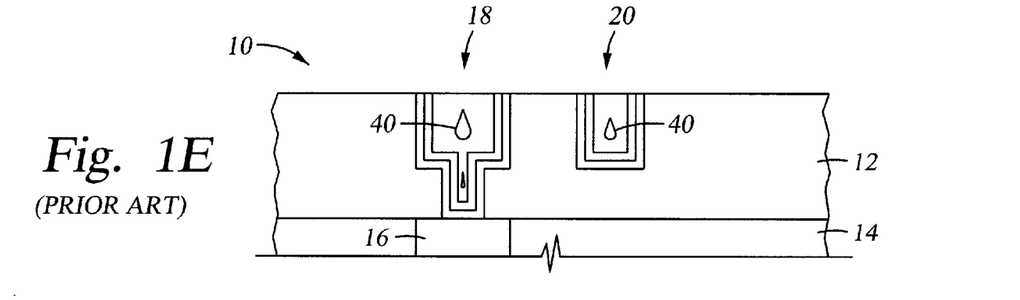

Referring to FIG. 1E, the top portion of the processed substrate 10, i.e., the exposed electroplated copper layer 38 (shown in FIG. 1D), is then planarized, preferably by chemical mechanical polishing (CMP). During the planarization process, portions of the copper layer 38, copper seed layer 36, barrier layer 34, and a top surface of the dielectric layer 12 are removed from the top surface of the substrate, leaving a fully planar surface with conductive interconnect features, such as the dual damascene structure 18 and connection line 20.

Metal electroplating in general is a well known art and can be achieved by a variety of techniques. Present designs of cells for electroplating a metal onto a substrate are generally based on a fountain plater configuration. In the fountain plater configuration, the semiconductor substrate is positioned above a cylindrical electrolyte container with the plating surface facing an opening of the cylindrical electrolyte container. The electrolyte is pumped to flow upwardly and contact the substrate plating surface. The substrate is electrically biased and connected as the cathode of the plating system, and the surfaces to be plated are electrically connected to the cathode power source to provide the electrical current that induces the metal ions in the plating solution to deposit onto the exposed conductive surface of the substrate. An anode is typically disposed in the electrolyte and electrically biased to attract the negatively charged counterparts of the metal ions in the electrolyte. The fountain plater is generally adequate for electroplating large, low aspect ratio features (i.e., larger than micrometer-sized and lower than 1:1 height to width ratio). However, a number of obstacles impair consistent electroplating of copper onto substrates having sub-micron, high aspect ratio features.

First, a continuous metal seed layer is essential for conducting the current required to the surfaces to be plated by the electroplating process. When a discontinuity is present in the metal seed layer, the portion of the seed layer that is not electrically connected to the bias power supply does not receive deposition during the electroplating process. Particularly with physical vapor deposition of a seed layer, it is very difficult to deposit a continuous, uniform seed layer within a high aspect ratio, sub-micron feature. The seed layer tends to become discontinuous especially at the bottom surface of the feature because it is difficult to deposit through the narrow (i.e., sub-micron) aperture width of the feature. The discontinuities in the seed layer prevent proper electroplating of the metal onto the seed layer, resulting in defective devices on the processed substrate.

Second, to prevent void formation in a high aspect ratio feature, the seed layer is preferably deposited only on the bottom surfaces of the feature so that the electroplating process provides a bottom-up fill of the feature. When the seed layer is formed on the sidewalls as well as the bottom of the feature, the electroplating process deposits the metal on both surfaces within the feature. Because of the high aspect ratio of the feature, the electroplated metal growth on the wall tends to close off the feature at the aperture opening before the feature has been completely filled, resulting in a void forming within the feature. The void changes the material and operating characteristics of the interconnect feature and may cause improper operation and premature breakdown of the device.

Therefore, there is a need for a consistent metal electroplating technique to form void-less metal interconnects in sub-micron, high aspect ratio features on semiconductor substrates. Particularly, there is a need for a method for preparing a substrate prior to electroplating that overcomes the problems presented by currently practiced seed layers used in electroplating and reduces the formation of defective devices due to unsatisfactory electroplating results.

SUMMARY OF THE INVENTION

The invention generally provides a consistent metal electroplating technique to form void-less metal interconnects in sub-micron, high aspect ratio features on semiconductor substrates. More specifically, the invention provides a method for preparing a substrate prior to electroplating to overcome the tendency of the deposition growth on the sidewall to grow over the opening before the base of the feature is filled.

One aspect of the invention provides a method for filling a structure on a substrate comprising depositing a conductive or semiconductive barrier layer on one or more surfaces of the structure, depositing a seed layer over the barrier layer, removing a portion of the seed layer, and electrochemically depositing a metal, such as copper, to fill the structure. Preferably, the seed layer is deposited using high density plasma physical vapor deposition (HDP-PVD) techniques, such as ionized metal plasma (IMP) PVD techniques, to provide a flux of ionized material in a direction substantially perpendicular to the substrate and thus substantially parallel to the sidewall, forming a relatively thin seed layer on the sidewall portion of the structure and a relatively thick seed layer on the base portion of the structure. The parameters of the HDP-PVD deposition are adjusted to maximize the deposition on the base portion of the structure while minimizing deposition on the sidewall portion of the structure.

Preferably, a portion or all of the seed layer formed on the sidewall portion of the structure is removed using a de-plating process prior to the electroplating process, exposing the underlying barrier layer. The de-plating process generally comprises performing the electroplating process with the polarity of the electrical bias reversed between the cathode and the anode of the electroplating system. The remaining seed layer on the base portion of the structure after the de-plating process provides a substantially bottom-up or vertical growth of the electroplating deposition that fills the structure without formation of voids therein. Alternatively, where the plating media/electrolyte is sufficiently acidic, the plating media/electrolyte can be used to chemically etch the relatively thin sidewall seed layer before plating is begun.

Preferably, the barrier layer comprises a conductive material selected from the group of tungsten (W), tungsten nitride ($WN_x$, where $0 \leq x \leq 3$), titanium (Ti), titanium nitride ($TiN_x$), and combinations thereof. By providing such a conductive barrier layer, current for electroplating copper at the base of the via can be transmitted throughout the substrate, while the plating of copper preferentially occurs on the copper seed layer at the base of the via, filling the via from the bottom up. The invention reduces the defect formations formed during the electroplating process due to discontinuities in the seed layer.

Another aspect of the invention provides a method for preparing a substrate for electrochemical deposition of a metal thereon, comprising depositing a barrier layer on one or more surfaces of the substrate, depositing a seed layer over the barrier layer in a high density plasma physical vapor deposition (HDP-PVD) chamber to provide a seed layer deposition profile having a ratio between a sidewall deposition thickness and a bottom deposition thickness between about 1:1 and about 1:3, and removing a portion of the seed layer. Preferably, the step of removing a portion of the seed layer comprises electrochemically de-plating a portion of the seed layer.

BRIEF DESCRIPTION OF THE DRAWINGS

So that the manner in which the above recited features, advantages and objects of the present invention are attained can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

The present invention provides several solutions that improve the electroplating fill of high aspect ratio, sub-micron interconnect features. Although the invention is described in reference to a dual damascene structure on a substrate, the invention contemplates applications in other interconnect features and other integrated circuit features (i.e., lines, vias, contacts, plugs, etc.) that require filling the features formed on a substrate with a metal to create interconnections. Also, although the invention is described using copper as the electroplated metal for metallization of the feature, the invention is applicable to other metals that can be electroplated onto a substrate.

One aspect of the invention improves the electroplating fill of high aspect ratio, sub-micron interconnect features through the use of a barrier layer material on which a metal, particularly copper, can be directly electroplated. In the prior art, a continuous seed layer having the properties of the material to be plated, i.e., a copper seed layer for copper plating, was deemed necessary. The seed layer provides both a current path to distribute current to the surfaces of the vias to enable plating thereon and a surface of the same metal being plated for ease of plating deposition. Generally, a continuous metal seed layer is essential for conducting the current required to the surfaces to be plated by the electroplating process. Typically, the seed layer is deposited using CVD or PVD techniques. However, it has been difficult to deposit a uniform, continuous seed layer at the bottom of high aspect ratio, sub-micron features. Thus, currently practiced electroplating techniques suffer from defect formation due to discontinuities in the seed layer. In one aspect, the invention provides a barrier layer that reduces the need for deposition of a continuous seed layer.

The inventors have discovered that the detrimental effects of a discontinuous seed layer are significantly minimized by providing a barrier layer material on which a metal, particularly copper, can be directly electroplated. The barrier layer materials that have this property include tungsten (W), tungsten nitride ($WN_x$, where $0 \leq x \leq 3$), titanium (Ti), titanium nitride (TiN) and combinations thereof. The barrier layer can also comprise a multi-layered stack of these materials as well as alloys of these materials. The barrier layer according to the invention can be deposited over the surfaces of the features/structures formed on the substrate using PVD, CVD or other deposition methods commonly known in the art. Because a metal, particularly copper, can be electroplated directly onto these barrier materials, a uniform and continuous seed layer is not required for the electroplating process. The metal deposits (i.e., electroplates) on the seed layer as well as on the portions of the barrier layer not covered by the seed layer, resulting in a significant reduction of the formation of defects due to the discontinuities in the seed layer.

Figure 2A:
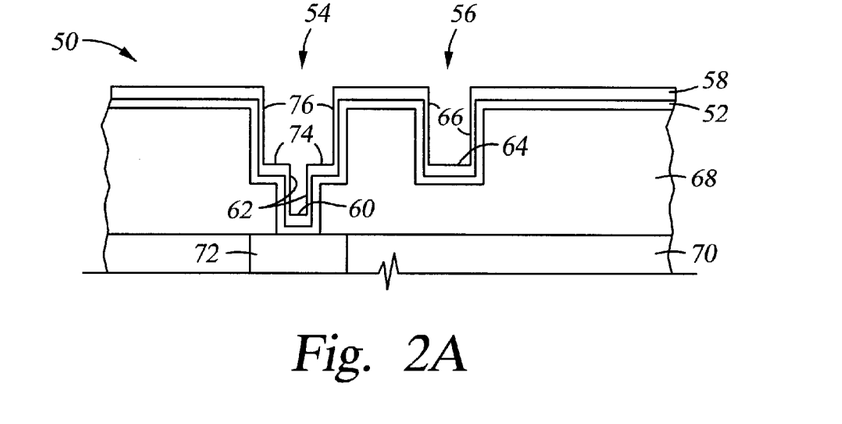
FIG. 2A is a cross sectional diagram of a dual damascene structure 54 and a connection line 56 having a seed layer 58 deposited using HDP-PVD techniques.

Another aspect of the invention improves the electroplating fill of high aspect ratio, sub-micron interconnect features through the use of high density plasma physical vapor deposition (HDP-PVD), particularly, ionized metal plasma (IMP) physical vapor deposition, technology to deposit the seed layer. Generally, the seed layer deposited using HDP-PVD according to the invention provides minimal sidewall coverage and concentrates deposition on the base portions of the structure. The seed layer material preferably comprises Ta, $TaN_x$, Ti, $TiN_x$, W, $WN_x$, and combinations thereof. FIG. 2A shows a cross sectional diagram of a dual damascene structure 54 and a connection line 56 having a seed layer 58 deposited using HDP-PVD techniques. Prior to the deposition of the seed layer 58, a barrier layer 52 has been deposited over the substrate 50 and the surfaces of the dual damascene structure 54 and the connection line 56 in the dielectric layer 68 of the substrate 50 using a commonly known deposition technique such as PVD and CVD. Alternatively, the barrier layer 52 is also deposited utilizing HDP-PVD techniques.

Referring to FIG. 2A, the substrate 50 includes a dielectric layer 68 formed over an underlayer 70. The dual damascene structure 54 is positioned above an electrically conducting feature 72 in the underlayer 70. The base portion 60 and the step portions 74 of the dual damascene via structure has a relatively thicker deposition than the deposition formed on the lower sidewall portions 62 and the upper sidewall portions 76 of the via structure. Similarly for the connection line 56, the deposition on the base portion 64 of the connection line structure is much thicker than the deposition on the sidewall portions 66 of the connection line structure. The HDP-PVD technique significantly reduces the seed layer formation on the sidewall portions (i.e., vertical portions) of the features (i.e., vias, lines, contacts, plugs, etc.) which promotes filling of the feature in the vertical direction, or in other words, bottom-up fill of the feature. The reduced sidewall seed layer formation decreases the horizontal growth of the deposited metal in the feature and at the upper edge of the feature during the electroplating process, resulting in a significant reduction in void formations in the features. Preferably, the seed layer is deposited to achieve a deposition profile having a ratio between a sidewall deposition thickness and a bottom deposition thickness between about 1:1 and about 1:3.

Figure 6:
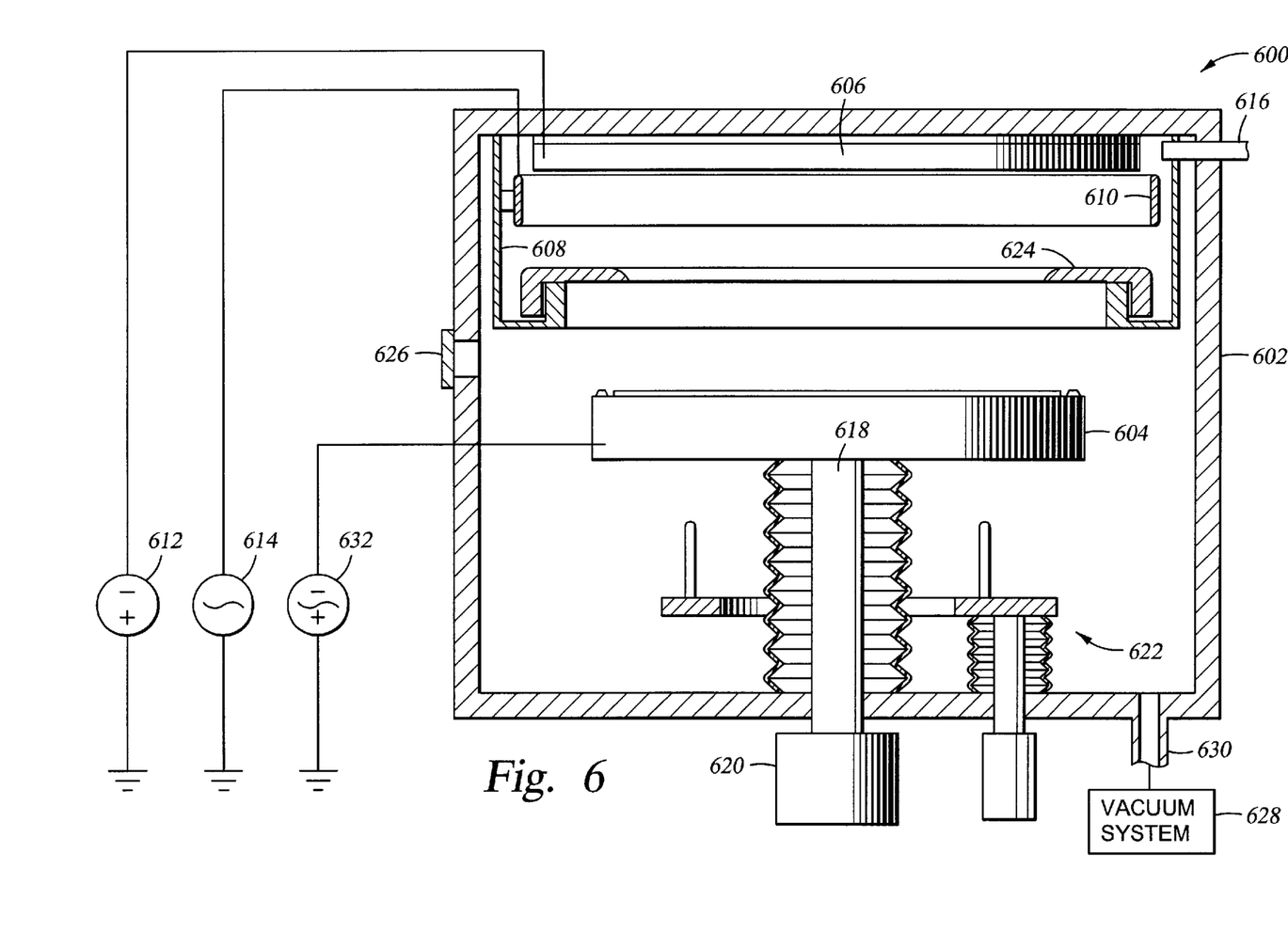
FIG. 6 is a cross sectional view of a high density plasma physical vapor deposition (HDP-PVD) chamber useful for forming a seed layer according to the present invention.

FIG. 6 is cross sectional view of a high density plasma physical vapor deposition (HDP-PVD) chamber useful for forming a seed layer according to the present invention. An example of a HDP-PVD chamber is the IMP® chamber available from Applied Materials, Inc., of Santa Clara, Calif. The HDP-PVD deposition chamber 600 generally includes a chamber enclosure 602, a substrate support member 604, a target 606, a shield 608 and a coil 610. The target 606 comprises a sputterable material and is disposed opposite of the substrate support member 604. The target 606 is electrically connected to a DC power supply 612, as shown in FIG. 6, and can be biased by an RF power source (not shown) instead of the DC power supply 612. The shield 608 generally surrounds the region between the target 606 and the substrate support member 604 and is typically connected to a ground connection. The coil 610 is disposed interior of the shield 608 and is connected to an RF power supply 614. A gas inlet 616 disposed through the enclosure 602 introduces one or more processing gases into the chamber during processing. A vacuum system 628 is connected to the chamber 600 through an exhaust port 630 to exhaust gases in the chamber and maintain a desired pressure in the chamber. Preferably, the vacuum system 628 comprises one or more vacuum pumps, turbo-molecular pumps, roughing pumps or cryopumps.

As shown in FIG. 6, the substrate support member 604 is attached to an actuator shaft 618 disposed through the bottom of the enclosure 602. The actuator shaft 618 is connected to an actuator 620 which facilitates movement of the substrate support member 604 to various positions in the chamber. A slit valve 626 disposed on a sidewall of the enclosure 602 facilitates transfer of substrates into and out of the chamber, which is typically performed utilizing a robot and robot blade. A substrate lift assembly 622 disposed relative to the substrate support member 604 facilitates positioning of a substrate onto and off of the substrate support member 604. As shown in FIG. 6, the substrate support member 604 is in a wafer transfer position. During processing, the substrate support member 604 positions a substrate disposed thereon to a position below a cover ring 624 disposed on a lower portion of the shield 608 to shield the perimeter edge of the substrate from deposition. The substrate support member 604 engages the cover ring 624 and typically lifts the cover ring 624 off the shield 608. At this position, a processing region is defined by the exposed surface of the target 606, the shield 608 and the substrate on the substrate support member 604. A power supply 632 is electrically connected to the substrate support member 604 to provide an electrical bias to the substrate during processing. The power supply 632 can be a DC power source, an RF power source, or a combination of DC and RF power sources.

Several parameters of the HDP-PVD process can be adjusted to achieve the desired seed layer deposition profile having minimal sidewall coverage and substantial bottom coverage. According to the invention, the HDP-PVD processing parameters, such as the processing pressure, the RF bias to the RF coil, the DC or RF bias to the target, and the DC or RF bias to the substrate, are adjusted to re-sputter deposition from the sidewall portions of the features to the base portions of the features. Typically, the HDP-PVD processing parameters are adjusted to achieve a ratio of sidewall re-sputtering rate to deposition rate of up to about 2:3. For a 200 mm substrate, the chamber processing pressure is preferably maintained at between about 20 mTorr and about 100 mTorr, the RF source power to the HDP-PVD coil at between about 1000 W and about 5000 W, the target DC bias at between about 500 W and about 3000 W and substrate DC bias at between about 100 W and about 500 W.

For example, a seed layer can be deposited using the following processing parameters: chamber pressure at about 14 mTorr, RF source power to the HDP-PVD coil at about 3000 W, target DC bias power at about 1000 W, substrate DC bias power at about 350 W, and processing time for about 60 seconds. The seed layer preferably has between about 1500 Å and about 2500 Å thickness over the field of the substrate, between about 150 Å and about 300 Å thickness over the base surface of the feature and less than about 100 Å, even more preferably, less than about 50 Å, thickness deposited on the sidewall portions of the feature.

Figure 2B:
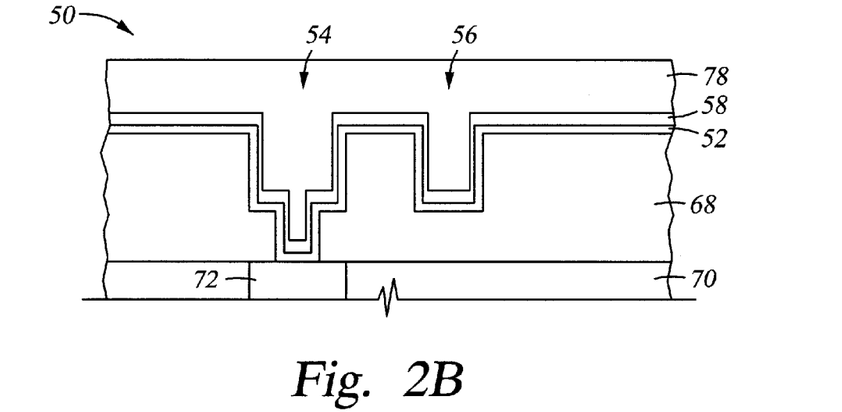
FIG. 2B is a partial cross sectional diagram of a substrate 50 after the electroplating metallization process.
Figure 2C:
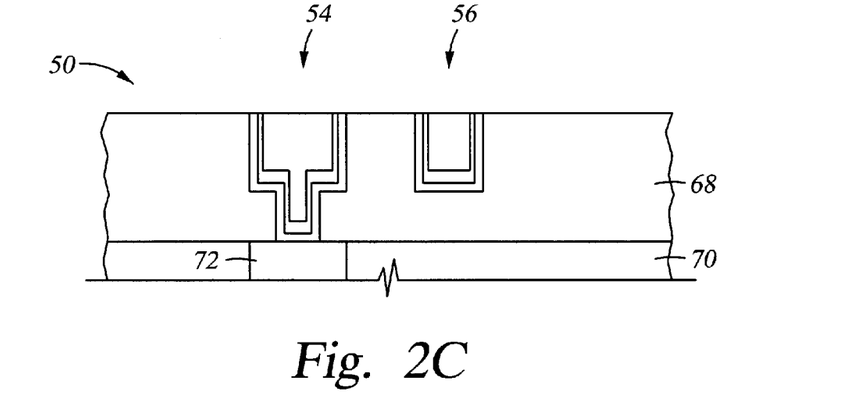
FIG. 2C is a cross sectional view of a substrate 50 after the top surface of the electroplated substrate has been planarized through a CMP or other planarizing process.

FIG. 2B is a partial cross sectional diagram of a substrate 50 after the electroplating metallization process. The interconnect features (i.e., structure 54 and line 56) are completely filled with the electroplated metal and have no void formation within the features. The electroplated metal layer 78 is deposited using electroplating techniques well known in the art. FIG. 2C is a cross sectional view of a substrate 50 after the top surface of the electroplated substrate has been planarized using chemical mechanical polishing (CMP) or other planarizing processes. The substrate 50 having the resulting dual damascene structure 54 and connection line 56 in the dielectric layer 68 is ready for other processes to complete the substrate processing.

Removal of Seed Layer From the Sidewall Portion of the Feature

Another aspect of the invention improves the electroplating fill of high aspect ratio, sub-micron interconnect features by removing a substantial portion of the seed layer deposited on the sidewall portions of the features prior to the electroplating process. Generally, the term "bottom-up fill" defines a desirable deposition characteristic that fills an interconnect feature in a vertical direction from the base portion of the feature upwardly to the top portion of the feature without deposition growth in a horizontal direction within the feature and at the upper edge of the feature. Although the invention is described using a substrate disposed to receive processing on an upper surface, it is understood that the invention is applicable to substrate processing wherein the substrate is positioned to receive processing in other orientations and that directional terms, such as "top," "bottom," "upper," "lower," etc., as used herein, are relative to the substrate orientation.

The invention provides a method of removing a thin seed layer from the sidewall portion of the feature while retaining a portion of the seed layer deposited on the base portion of the feature. Generally, the method comprises de-plating a portion of the seed layer prior to the electroplating process. Preferably, the barrier layer comprises a conductive or semi-conductive material as described above, and the seed layer is deposited using the above described HDP-PVD technique to minimize the deposition on the sidewall portions of the features. For a seed layer profile as shown in FIG. 2A, the de-plating process removes a portion or all of the seed layer on the sidewall portions of the feature while removing approximately the same quantity of the seed layer on the base portion of the feature which is but a fraction of the thicker portion of the seed layer. After the de-plating process, the barrier layer, which is more difficult to remove by de-plating than the seed layer material, remains on the sidewall portions of the feature. The de-plating process generally comprises performing the electroplating process with the electrical bias polarities reversed between the cathode and the anode of the electroplating system. Alternatively, where the plating bath is sufficiently reactive, the seed layer may be simply etched by the bath before plating is initiated.

Figure 4:
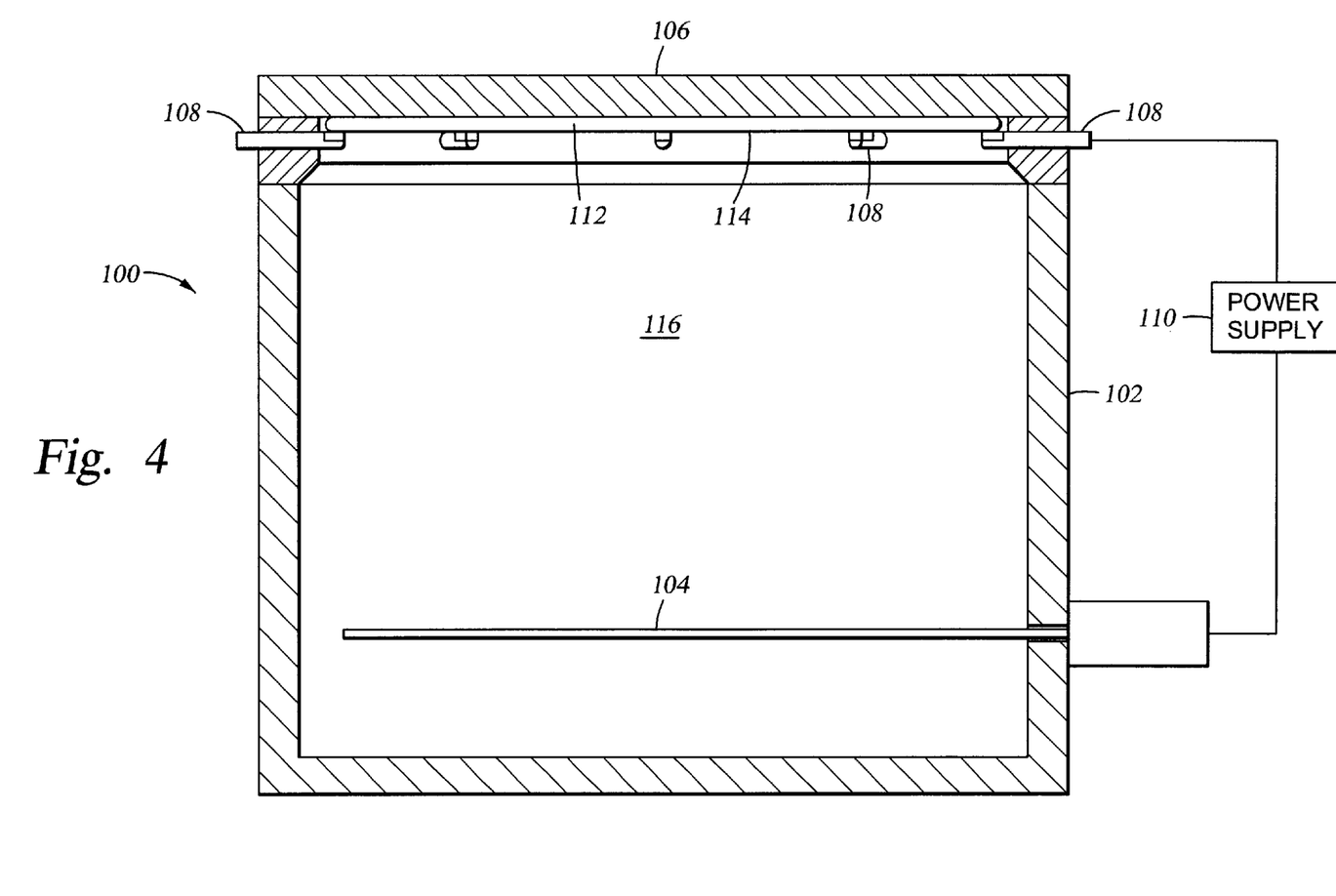
FIG. 4 is a cross sectional view of a simplified electroplating apparatus 100.

FIG. 4 is a cross sectional view of a simplified electroplating apparatus 100. Although the invention is described using a simplified electroplating apparatus, the inventors contemplate utilizing other electroplating apparatuses to achieve the desired processing results, such as the Electra™ Cu ECP system, available from Applied Materials, Inc., of Santa Clara, Calif., and the electrochemical deposition system described in commonly assigned and copending U.S. patent application Ser. No. 09/289,074, entitled "Electrochemical Deposition System," filed on Apr. 8, 1999, which is hereby incorporated by reference in its entirety.

As shown in FIG. 4, the simplified electroplating apparatus 100 includes a container 102, an anode 104, a substrate holder 106, a cathode 108 and a power supply 110 connected between the cathode 108 and the anode 104. The power supply according to the invention is capable of delivering a forward plating voltage/current density and a reverse de-plating voltage/current density, which can be switched between the cathode and the anode. A substrate 112 is positioned on the substrate holder 106, and the cathode 108 contacts and provides electrical power to a substrate plating surface 114. An electroplating solution or electrolyte 116 fills the container 102 to allow the substrate plating surface 114 to be completely submerged in the electrolyte during the electroplating process. Preferably, the anode 102 comprises a consumable anode that supplies the metal (i.e., copper) to be electrochemically deposited onto the substrate, and the electrolyte 116 effectuates the transfer of the metal from the anode to the cathode. Alternatively, the electrolyte 116 contains and supplies the metal to be electrochemically deposited onto the substrate, and the anode 104 is a non-consumable anode.

The copper electroplating solution preferably comprises multi-components including copper electrolyte and additives such as suppressers and brighteners/accelerators. A detailed description of the electroplating chemistry, particularly the composition of the electrolyte and additives, is provided in commonly assigned and copending U.S. patent application Ser. No. 09/245,780, entitled "Electrodeposition Chemistry for Improved Filling of Apertures," filed on Feb. 5, 1999, which is hereby incorporated by reference in its entirety. The composition of the electroplating solution preferably comprises 0.85M copper sulfate with a pH of about 1.75 after adding suppressers and accelerators. The temperature of the electroplating solution is preferably maintained between about 15° C. to about 25° C.

During an electroplating process, the power supply 110 provides a negative voltage to the cathode 108 and a positive voltage to the anode 104 to effectuate electrochemical deposition of the metal ions in the electrolyte 116 onto the substrate plating surface 114. The electrical power (i.e., voltage and current) supplied to the substrate plating surface 114 is adjusted according to the electroplating solution used, the desired deposition rate and the desired deposition characteristics. For example, to electroplate a copper layer onto a seed layer on a substrate using an electroplating solution comprising 0.85M copper sulfate having suppressers and accelerators added, the cathode 108 is to provide a forward plating current density across the substrate plating surface at between about 10 mA/cm$^2$ and about 80 mA/cm$^2$.

During a de-plating process, the power supply 110 provides a positive voltage to the cathode 108 and a negative voltage to the anode 104 to effectuate removal of metal from the substrate plating surface 114. Because the bias polarity is reversed, the positively biased cathode 108 releases metal ions from the substrate plating surface 114 into the electrolyte 116, and the negatively biased anode 104 collects metal ions in the electrolyte 116.

According to the invention, for the de-plating process to remove a portion or all of the seed layer from the sidewall portion of a feature on a substrate, the substrate is typically biased at a reverse (de-plating) voltage between about 10V and about 25V or a reverse (de-plating) current density between about 10 mA/cm$^2$ and about 80 mA/cm$^2$ while the anode is also reverse biased to attract metal ions in the electrolyte solution. The de-plating process is typically performed for between about 0.1 second and about 10 seconds. The parameters of the de-plating process, including the length of time and the power applied to the substrate and the anode, can be adjusted according to the thickness of the deposition to be removed from the sidewalls of the interconnect features. The electrolyte used for the de-plating process also affects the de-plating rate and profile.

Figure 3A:
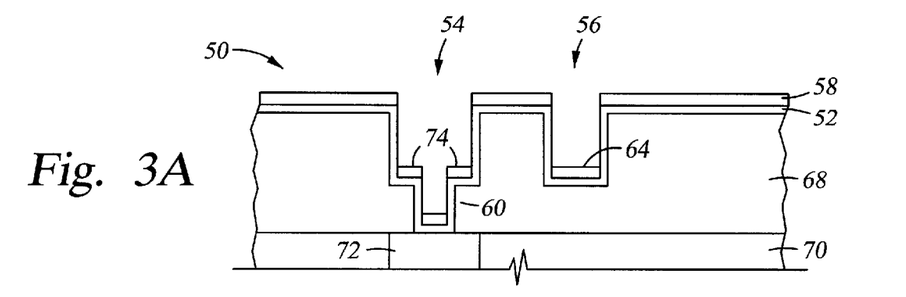
FIG. 3A is a cross sectional diagram of a substrate 50 showing the remaining seed layer after a short de-plating process.

FIG. 3A is a cross sectional diagram of a substrate 50 showing the remaining seed layer after a de-plating process. The remaining seed layer 58 preferably covers the non-sidewall surfaces of the features on the substrate, including the base portion 60 and the step portion 74 of the dual damascene structure 54 and the base portion 64 of the connection line 56. The barrier layer remains on the sidewall portions (i.e., vertical surfaces) of the feature. As shown in FIG. 3A, the seed layer on the sidewall portions has been completely removed. Alternatively, a thin (i.e., <50 Å) or discontinuous seed layer may remain on the sidewall portion of the feature. The electroplating current is distributed throughout the wafer by contacting the seed layer about the edge of the wafer and conducted through the barrier layer where the seed layer is discontinuous. The de-plating process provides the ideal seed layer profile to achieve complete bottom-up fill because the electroplated metal grows in a substantially vertical direction from a horizontal surface, such as the base of the feature. The electroplated copper deposits preferentially on copper seed layer surfaces at the base portions of the feature while the electroplated copper deposits much slower on the barrier layer surfaces on the sidewall portions of the feature.

Figure 3B:
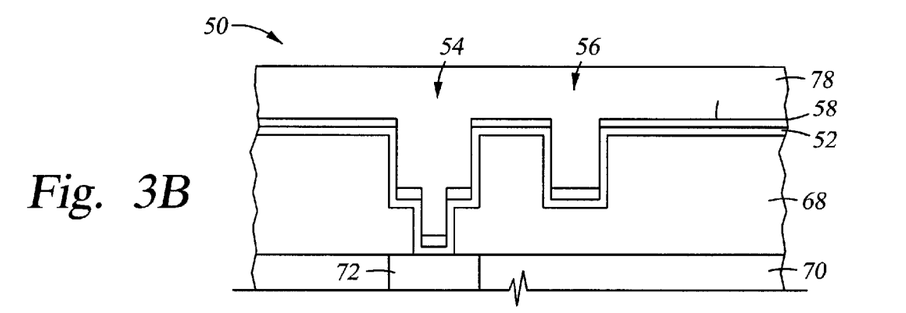
FIG. 3B is a cross sectional diagram of a substrate 50 showing an electroplated metal layer 78 filling the interconnect features (i.e., structure 54 and line 56) without void formations.
Figure 3C:
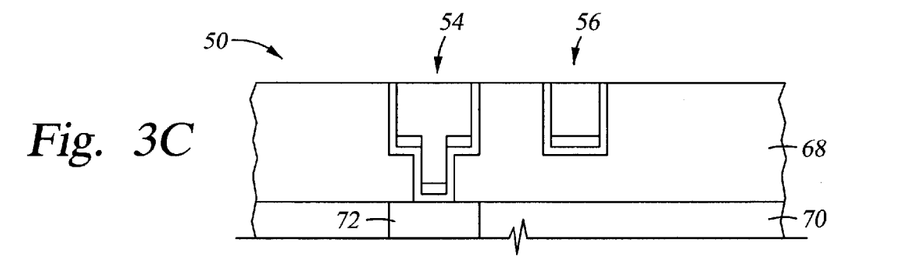
FIG. 3C is a cross sectional diagram of a planarized substrate 50 having void-less, metallized dual damascene structure 54 and connection line 56.

FIG. 3B is a cross sectional diagram of a substrate 50 showing an electroplated metal layer 78 filling the interconnect features (i.e., structure 54 and line 56) without void formations. FIG. 3C is a cross sectional diagram of a planarized substrate 50 having void-less, metallized dual damascene structure 54 and connection line 56. After the planarization process, the substrate 50 is ready for other processes to complete the substrate processing.

Figure 5:
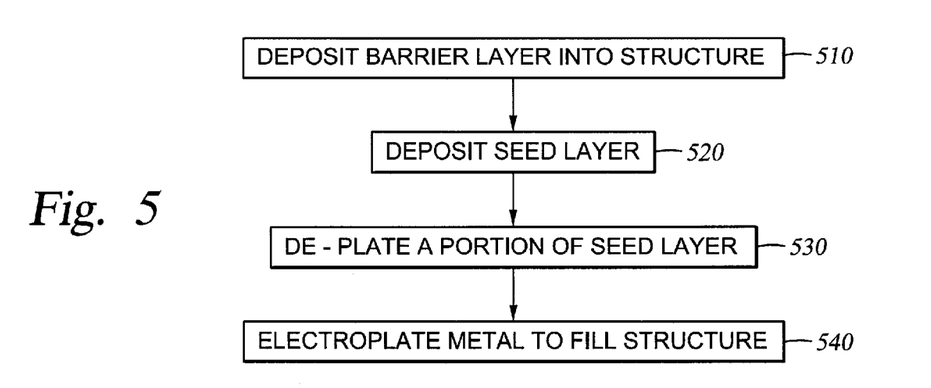
FIG. 5 is a flow diagram illustrating a metallization technique for filling an interconnect structure according to the invention.

FIG. 5 is a flow diagram illustrating a metallization technique for filling an interconnect structure according to the invention. First, a barrier layer is deposited over the surfaces of the substrate including the surfaces outlining the interconnect structure (step 510). Preferably, the barrier layer material comprises a conductive or semi-conductive material selected from the group comprising tungsten (W), tungsten nitride ($WN_x$, where $0 \leq x \leq 3$), titanium (Ti) and titanium nitride ($TiN_x$), and the combinations thereof. The barrier material can be deposited using commonly known deposition techniques, including CVD, PVD and other deposition methods. Alternatively, the barrier material comprises other typical barrier material suitable for protecting the other components on the substrate and the metal to be electroplated, such as tantalum (Ta), tantalum nitride ($TaN_x$) and/or combinations thereof. Preferably, the barrier layer has a film thickness between about 50 Å and about 250 Å, more preferably about 100 Å, for an interconnect structure/feature having an opening width between about 180 nanometers (0.18 µm) and about 250 nanometers (0.25 µm).

Second, a seed layer is deposited over the barrier layer (Step 520), preferably using HDP-PVD techniques as described above to maximize the seed layer deposition on the base portion of the interconnect features and minimize the seed layer deposition on the sidewall portions of the interconnect feature. The seed layer preferably has a sidewall film thickness between about 50 Å and 100 Å and a bottom film thickness between about 150 Å and about 300 Å.

Next, a portion of the seed layer is de-plated to remove a portion of the seed layer from the sidewall portion of the interconnect feature (Step 530). Preferably, the de-plating process is carried out using an electroplating apparatus with the bias polarity reversed (opposite of the electroplating polarity) to cause a portion of the seed layer to be removed from the interconnect feature. To remove the thin seed layer from the sidewall portion of the feature, the de-plating process is typically carried out for a short period of time so that an adequate amount of the seed layer remains on the base portion of the feature to carry out the electroplating process. For example, the de-plating process is carried out by applying to the substrate a de-plating current density between about 10 mA/cm² and about 80 mA/cm² for between about 0.1 second and about 10 seconds to remove a portion or all of the seed layer on a sidewall portion of the feature. A similar thickness of the seed layer is typically removed from the base portion of the feature. However, because the base portion seed layer is much thicker relative to the sidewall portion, a majority of the seed layer remains on the base portion of the feature. Preferably, the de-plating process leaves the barrier layer with very little (<50 Å) or none of the seed layer remaining on the sidewall portion of the feature while a seed layer having a thickness between about 75 Å and about 250 Å remains on the base portion of the feature. The substrate is prepared for electrochemical deposition according to steps 510, 520, and 530 as described above.

Once the seed layer on the sidewall portion of the feature has been reduced or removed, the electroplating process is performed to metallize the structures on the substrate (Step 540). The electroplating process can be accomplished using a variety of electroplating apparatus and techniques, such as the electroplating process described above. For example, to electroplate a copper layer onto a substrate using an electroplating solution comprising 0.85M copper sulfate having suppressers and accelerators added, the cathode 108 is provided a forward plating current density across the substrate plating surface at between about 10 mA/cm² and about 80 mA/cm² for between about 5 seconds and about 30 seconds to fill a sub-quarter micron sized feature. Because the seed layer predominately occupies the horizontal surfaces of the structure, the deposition grows in a substantially vertical direction to fill the structure with metal deposits without the formation of voids in the structure. After the electroplating fill or metallization of the structure, the surface of the processed substrate is typically planarized using CMP techniques or other planarization methods, and the substrate is ready for other processes to complete the fabrication of the integrated circuit.

While the foregoing is directed to the preferred embodiment of the present invention, other and further embodiments of the invention may be devised without departing from the basic scope thereof. The scope of the invention is determined by the claims which follow.

What is claimed is:

1. A method for filling a structure on a substrate, comprising:
    a) depositing a barrier layer on one or more surfaces of the structure;
    b) depositing a seed layer over the barrier layer;
    c) removing a portion of the seed layer in the structure, wherein the resulting seed layer is thicker on a bottom surface of the structure than on a sidewall surface of the structure; and
    d) electrochemically depositing a metal to fill the structure.

2. The method of claim 1 wherein the step of removing a portion of the seed layer comprises electrochemically de-plating a portion of the seed layer.

3. The method of claim 2 wherein the seed layer is de-plated using a de-plating current density across a substrate surface at between about 10 mA/cm² and about 80 mA/cm².

4. The method of claim 2 wherein the seed layer is de-plated for between about 0.1 second and about 10 seconds.

5. The method of claim 1 wherein the seed layer is deposited to achieve a deposition profile having a ratio between a sidewall deposition thickness and a bottom deposition thickness between about 1:1 and about 1:3.

6. The method of claim 5 wherein the seed layer has a sidewall deposition thickness less than about 50 Å and a bottom deposition thickness between about 75 Å and about 250 Å.

7. The method of claim 1 wherein the seed layer is deposited in a high density plasma physical vapor deposition chamber.

8. The method of claim 7 wherein the seed layer is deposited in a HDP-PVD chamber having an RF coil biased between about 1000 W and about 5000 W, a target DC biased between about 500 W and about 3000 W, and a substrate biased between about 100 W and about 500 W.

9. The method of claim 7 wherein the seed layer is deposited in a HDP-PVD chamber at a pressure between about 20 mTorr and about 100 mTorr.

10. The method of claim 1 wherein the barrier layer comprises a material selected from the group comprising tungsten (W), tungsten nitride ($WN_x$, where $0 \leq x \leq 3$), titanium (Ti) and titanium nitride ($TiN_x$), and the combinations thereof.

11. The method of claim 1 wherein the seed layer is substantially removed from sidewall portions of the structure.

12. A method filling a structure on a substrate, comprising:
    a) depositing a barrier layer on one or more surfaces of the structure, wherein the barrier layer comprises a material selected from the group comprising tungsten (W), tungsten nitride ($WN_x$, where $0 \leq x \leq 3$), titanium (Ti) and titanium nitride ($TiN_x$), and the combinations thereof;
    b) depositing a discontinuous copper seed layer over the barrier layer; and
    c) electrochemically depositing copper to fill the structure.

13. The method of claim 12 wherein the barrier layer comprises a multi-layered stack of one or more materials selected from the group comprising tungsten (W), tungsten nitride ($WN_x$, where $0 \leq x \leq 3$), titanium (T) and titanium nitride ($TiN_x$), and the combinations thereof.

14. The method of claim 12, further comprising:
d) electrochemically de-plating a portion of the seed layer in the structure before electrochemically depositing copper to fill the structure, wherein the resulting seed layer is thicker on a bottom surface of the structure than on a sidewall surface of the structure.

15. A method for preparing a substrate for electrochemical deposition of a metal thereon, comprising:
   a) depositing a barrier layer on one or more surfaces of the substrate;
   b) depositing a seed layer over the barrier layer in a high density plasma physical vapor deposition (HDP-PVD) chamber to provide a structure on the substrate with a seed layer deposition profile having a ratio between a sidewall deposition thickness of the structure and a bottom deposition thickness of the structure between about 1:1 and about 1:3; and
   c) removing a portion of the seed layer in the structure; and
   d) electrochemically depositing copper on the seed layer.

16. The method of claim 15 wherein the step of removing a portion of the seed layer in the structure comprises electrochemically de-plating a portion of the seed layer in the structure.

17. The method of claim 16, wherein the seed layer is de-plated by applying a deplating current density across a substrate surface at between about 10 mA/cm$^2$ and about 80 mA/cm$^2$ for between about 0.1 second and about 10 seconds.

18. The method of claim 15 wherein the barrier layer comprises a material selected from the group comprising tungsten (W), tungsten nitride ($WN_x$, where $0 \leq x \leq 3$), titanium (Ti) and titanium nitride ($TiN_x$), and the combinations thereof.

19. The method of claim 15 wherein the seed layer is deposited in a HDP-PVD chamber having an RF coil biased between about 1000 W and about 5000 W, a target DC biased between about 500 W and about 3000 W, and a substrate biased between about 100 W and about 500 W.

20. The method of claim 15 wherein removing a portion of the seed layer in the structure results in a seed layer that is thicker on a bottom surface of the structure than on a sidewall surface of the structure.

* * * * *